United States Patent [19]
Meyer et al.

[11] Patent Number: 6,020,739
[45] Date of Patent: Feb. 1, 2000

[54] RAPID METHOD OF OPTIMAL GRADIENT WAVEFORM DESIGN FOR MRI

[75] Inventors: Craig H. Meyer, Mountain View; John M. Pauly, San Francisco, both of Calif.

[73] Assignee: The Board of Trustees of the Leland Stanford Junior University, Palo Alto, Calif.

[21] Appl. No.: 08/845,343

[22] Filed: Apr. 25, 1997

[51] Int. Cl.[7] ............................................. G01V 3/00
[52] U.S. Cl. ..................... 324/309; 324/300; 324/307; 324/318
[58] Field of Search ................... 324/309, 307, 324/300, 310, 311, 312, 313, 314, 318, 322

[56] References Cited

U.S. PATENT DOCUMENTS

| | | | |
|---|---|---|---|
| 4,642,567 | 2/1987 | Kaplan | 324/309 |
| 4,814,799 | 3/1989 | Lu | 346/160 |
| 5,105,152 | 4/1992 | Pauly | 324/309 |
| 5,122,747 | 6/1992 | Riederer et al. | 324/309 |
| 5,185,574 | 2/1993 | Ehman et al. | 324/309 |
| 5,270,653 | 12/1993 | Pauly | 324/309 |
| 5,539,313 | 7/1996 | Meyers | 324/309 |
| 5,652,516 | 7/1997 | Adalsteinsson et al. | 324/309 |

OTHER PUBLICATIONS

C.H. Meyer, J.M. Pauly, A. Macovski, "A Rapid, Graphical Method for Optimal Spiral Gradient Design," ISMRM, Apr. 27, 1996.

*Primary Examiner*—Christine K. Oda
*Assistant Examiner*—Brij B. Shrivastav
*Attorney, Agent, or Firm*—Townsend and Townsend and Crew LLP; Henry K. Woodward

[57] ABSTRACT

Spiral gradient design for a k-space trajectory using gradient amplifier parameters includes first determining an angle between a given gradient, $g_n$, and the next gradient, $g_{n+1}$, and then determining the magnitude of $|g_{n+1}|$ based on gradient constraints represented by a circle or other shape surrounding and offset from the distal end of $g_n$, where $g_{n+1}$ extends along $\angle g_{n+1}$ to the farthest intersection thereof with the circle.

8 Claims, 12 Drawing Sheets

First step: Find $\Delta\theta$ by evaluating the continuous derivative of k at $\tau_n$°

Second step: Determine maximum $[g_n+1]$ by finding intersection between the line at $\angle g_n+1$ and the constraint circle.

First step: Find $\Delta\theta$ by evaluating the continuous derivative of k at $\tau_n°$ Second step: Determine maximum $[g_n+1]$ by finding intersection between the line at $\angle g_n+1$ and the constraint circle.

RAPID METHOD OF OPTIMAL GRADIENT WAVEFORM DESIGN FOR MRI

The U.S. Government has rights in the invention pursuant-to NIH grant No. RO1CA50948 to Stanford University.

BACKGROUND OF THE INVENTION

This invention relates generally to magnetic resonance imaging and more particularly the invention relates to gradient waveforms for use in magnetic resonance imaging.

Nuclear magnetic resonance (NMR) imaging, also called magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation, the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_o$, of the precession of the nuclei is the product of the magnetic field $B_o$, and the so-called magnetogyric ratio, $\gamma$, a fundamental physical constant for each nuclear species:

$$\omega_o = B_o \cdot \gamma$$

Accordingly, by superimposing a linear gradient field, $B_z = Z \cdot G_z$ on the static uniform field, $B_o$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially localize the FID signals in the plane. The angle of nuclear spin flip in response to an RF pulse excitation is proportional to the integral of the pulse over time.

In-magnetic resonance imaging (MRI), the k-space formalism is used to design and analyze readout gradients and excitation gradients. During signal readout, a series of samples in k-space (or Fourier transform space) are acquired. The location in k-space where a particular sample is acquired is proportional to the integral of the readout gradient up to that time. In this application, we discuss the design of gradient waveforms using a particular algorithm. For concreteness, we discuss the design of gradients for spiral scans of k-space, but the technique can be used for the design of other scans as well, subject to certain constraints.

Spiral scans are an efficient way to cover k-space and have certain other advantages, such as good behavior in the presence of moving material such as flowing blood. They were first suggested by Likes and later independently by Ljunggren. Macovski proposed certain improvements, such as constant-linear-velocity spiral scans. Buonocore proposed a method for designing accelerated spiral gradients, see U.S. Pat. No. 4,651,096. Pauly suggested using spiral scans for selective excitation and designed constant-slew spiral gradients using an iterative approach. Hardy and Cline discussed another iterative method for designing constant-slew spiral gradients. Meyer et al. designed spiral readout gradients using both slew and amplitude constraints using an iterative technique. Spielman and Pauly and King described iterative methods for constant-voltage spiral readout gradients. Meyer and Macovski and Spielman et al. discussed the iterative design of spiral readout gradients with variable sampling densities. Meyer described the iterative design of spiral-in/spiral-out readout gradients. Heid described an approximate analytical framework for constant-slew readout gradients.

There are an infinite number of gradient waveforms that trace out a particular spiral K-space trajectory. The design of these gradient waveforms is an important element of spiral scanning, and a number of iterative approaches have been successfully applied to this problem. The present invention presents an analytical, non-iterative, graphical solution to this problem. This approach is much faster and more intuitive than earlier approaches. It easily incorporates different gradient circuit models and can lead to better designs than approaches that do not use the geometry of the problem.

SUMMARY OF THE INVENTION

This invention principally concerns fast spiral k-space scanning, a rapid MR imaging method that is gaining in popularity in both industry and academia. In particular, the invention is a new and better solution to the gradient waveform design problem.

The invention allows one to generate spiral gradient waveforms much more quickly than any of the other techniques available. This speed is important in a clinical environment, because scanning parameters often change from patient to patient and it is best to generate new gradient waveforms for each set of parameters. The speed will become even more important as we move to real-time MRI, because the parameters will then change during a scan, making gradient design speed even more important.

In addition to being a fast algorithm, the invention also generates better gradient waveforms. Unlike other techniques, this is a direct non-iterative technique, so that it exactly rather than approximately meets the discrete-time constraints. More importantly, the intuitive nature of the design allows one to efficiently adapt the design technique to different gradient circuit models. An important example is a voltage-limited design with an LR circuit model. This design technique allows one to see how to design maximally efficient gradients using this model, taking full advantage of the geometry of the problem.

Another advantage of the invention is that it allows one to efficiently and intuitively design new types of gradient waveforms, including variations of spirals as well as other types of gradient waveforms. There are some causality constraints that restrict the types of gradient waveforms that can be designed by the basic non-iterative algorithm, but in many cases these could be circumvented by segmenting the problem or by running "time" backwards. Four examples of new types of gradient waveforms that can be designed with this method are:

Spiral-in/spiral-out gradient waveforms that do not go to zero amplitude at the origin.

Variable-density gradient waveforms for spiral fluoroscopy.

Gradient waveforms for scanning with a large number of interleaves. These solve a similar problem that the so-called TWIRL gradients do, but in a more general fashion.

Spiral-in gradient waveforms that use the voltage stored in the gradient coil to speed up the scan. These can be useful for spiral excitation pulses, for example.

The invention and objects and failures thereof will be more readily apparent from the following detailed description and appended claims when taken with the drawings.

DETAILED DESCRIPTION OF THE SPECIFIC EMBODIMENTS

Figure 1A:
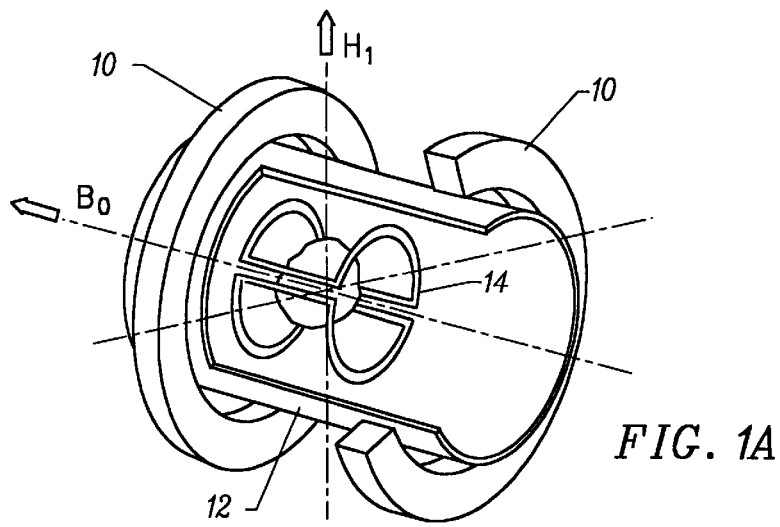
FIGS. 1A–1D illustrate the arrangement of MRI apparatus and magnetic fields generated therein.
Figures 1B, 1C, 1D:
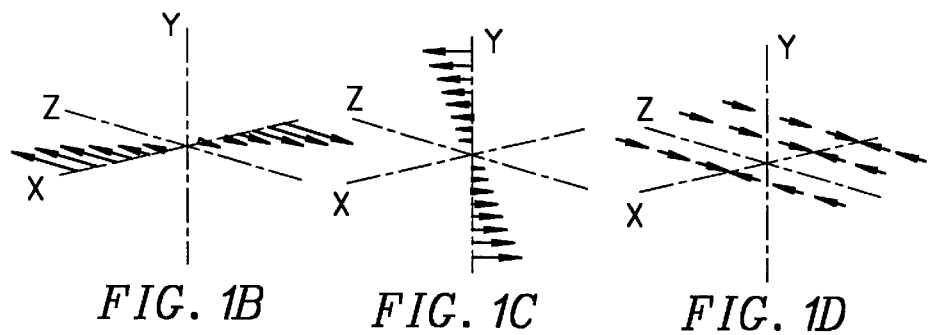

Referring now to the drawing, FIG. 1A is a perspective view partially in section illustrating coil apparatus in NMR imaging system, and FIGS. 1B–1D illustrate field gradients which can be produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field $B_o$ is generated by the magnet comprising the coil pair 10. A gradient field $G(x)$ is generated by a complex gradient coil set which can be wound on the cylinder 12. An RF field $B_1$ is generated by a saddle coil 14. A patient undergoing imaging would be positioned along the Z axis within the saddle coil.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectfully.

Figure 2:
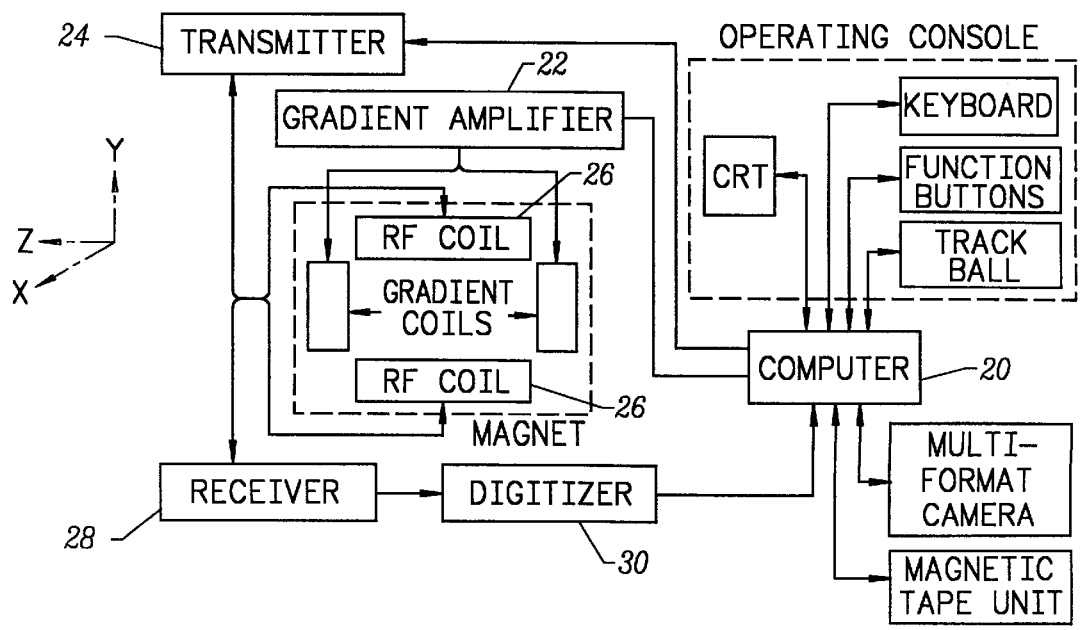
FIG. 2 is a functional block diagram of MR imaging apparatus.

FIG. 2 is a functional block diagram of the imaging apparatus. A computer 20 is programmed to control the operation of the NMR apparatus and process FID signals detected therefrom. The gradient field is energized by a gradient amplifier 22 and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

The present invention presents an analytical, non-interactive, graphical solution to this problem. This approach is much faster and more intuitive than our earlier approaches. It easily incorporates different gradient circuit models and can lead to better designs than approaches that do not use the geometry of the problem. This design rests on one simple discrete-time approximation, which is valid for the sampling time T, of a typical digital gradient waveform. The algorithm checks the validity of this approximation and reduces the internal value of T in the design as necessary. Here we describe the application of this method to one important design problem: the design of gradient waveforms that trace a given spiral trajectory in the minimum time, assuming a series LR gradient circuit model with a given maximum available amplifier voltage. We constrain the absolute value of the complex voltage to be no greater than the voltage V available on one axis, so that the gradients can be rotated to generate different interleaves. The basic approach can be modified to optimize on the axes separately.

Figure 3A:
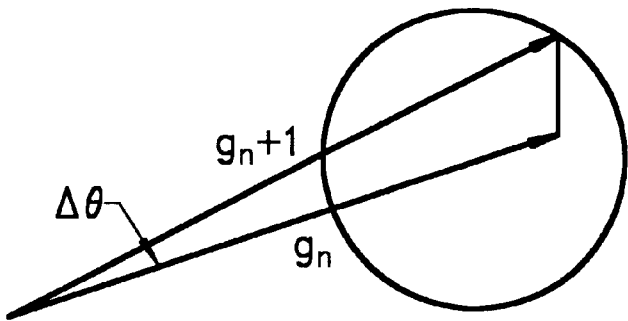
FIGS. 3A and 3B illustrate steps in practicing the present invention.

The desired k-space trajectory is $k(\tau) = A\tau e^{i\omega\tau}$, where $\tau$ is a function of time and is designed to be as large as possible in each sampling period. The discrete-time gradient waveform is $g_n$ and the discrete-time $k_n = \Sigma^n_{i=0} g_i$. The design starts with a given $g_0$ (typically zero) and then calculates $g_n$ successively for increasing values of n, terminating when either a desired radius in k-space is reached or after a desired number of samples. Two gradient amplifier parameters are needed: (1) G α V/R, the steady-state gradient amplitude with the maximum voltage V applied, and (2) S α V/LT, the maximum step in gradient amplitude possible starting from an amplitude of zero. FIG. 3A illustrates the first step in the design. Starting from a given $g_n$, we want to determine $g_{n+1}$. Because spiral gradients are continually rotating, $g_{n+1}$ will point in a slightly different direction than $g_n$. The first step in the design is to determine that direction, $\angle g_{n+1}$. We do this by evaluating the continuous first derivative of the expression $k(\tau)$ at the current value of $\tau$ and taking the argument of this evaluation. In this step, we are switching back and forth between continuous-time and discrete-time expressions, but in a way that leads to good results for reasonable values of the sampling time T. This step leads to the following expression:

$$\angle g_{n+1} = \tan^{-1}\left(\omega \frac{|k_n|}{A}\right) + \omega \frac{|k_n|}{A}.$$

Figure 3B:
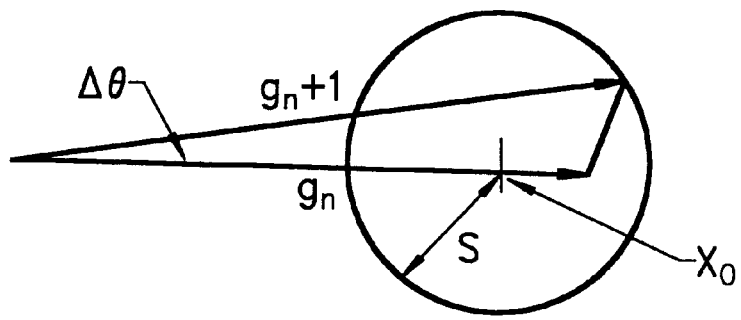

FIG. 3B illustrates the second step in the design. The gradient vectors have been rotated to lie along the x-axis for a worst-case design. Given $\angle g_{n+1}$, we solve for the maximum $$|g_n+1|$$

allowable under the gradient constraints. The constraints are represented by the circle. Solving for $$|g_n+1|$$

involves finding an intersection of the circle and a line at $\angle g_{n+1}$. Note that there are two intersections; we want the one corresponding to an increase in the gradient amplitude. The radius of the constraint circle is simply S, defined above. The shifting of the center of the circle away from the tip of $g_n$ is due to the voltage drop across the series resistance of the gradient coil, which leads to decreased voltage available for changing the current. (In a constant-slew design, the center of the circle is at the tip of $g_n$.) Solving for the intersection leads to the following expression:

$$|g_{n+1}| = Cx_o + \sqrt{S^2 + x_0^2(C^2 - 1)},$$

where

-continued $$x_0 = |g_n|(1 - S/G) \text{ and } C = 1 \Big/ \sqrt{1 + \tan^2 \Delta\theta}.$$

These two steps constitute the basic algorithm.

We implemented this design method on a Sum Sparc 20 workstation. It calculates a typical spiral gradient waveform in 50 ms, and the resulting discrete-time waveform is constant-voltage to the machine accuracy. We have used this technique to design for several different gradient hardware configurations and a number of pulse sequences, including high-resolution coronary artery imaging. The LR circuit model has particular advantages over a constant-slew model at the gradient amplitude (22 mT/m) available on our research scanner.

This spiral design approach is simple to understand and implement and leads to accurately optimized gradients. The speed of this approach makes it feasible to re-optimize spiral gradients as parameters change, even in a real-time setting. We have also applied this approach to the more difficult problem of the design of variable-density spiral gradients, and the general approach can be applied to the design of certain non-spiral gradients, as further illustrated in FIGS. 4–21.

Figure 4:
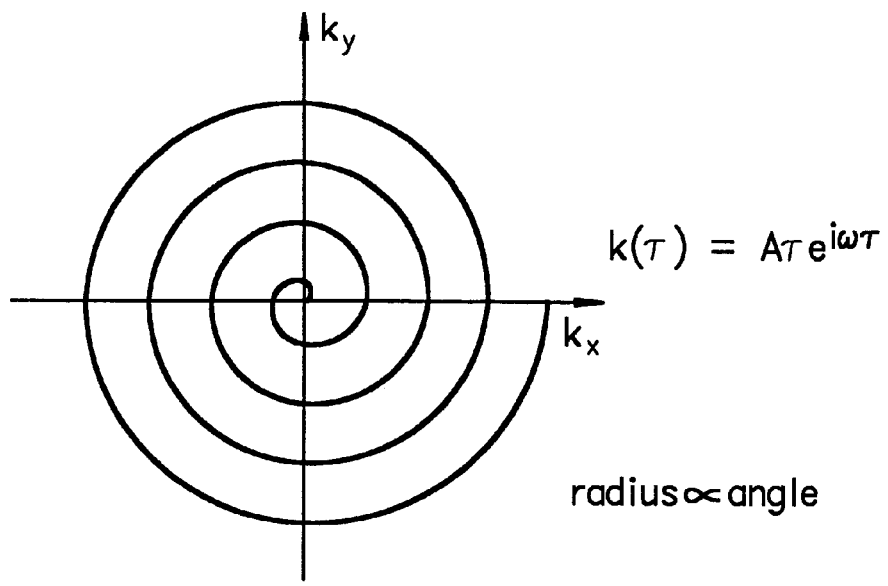
FIGS. 4–21 illustrate alternative steps and resulting gradients for other k-space spirals.
Figure 5:
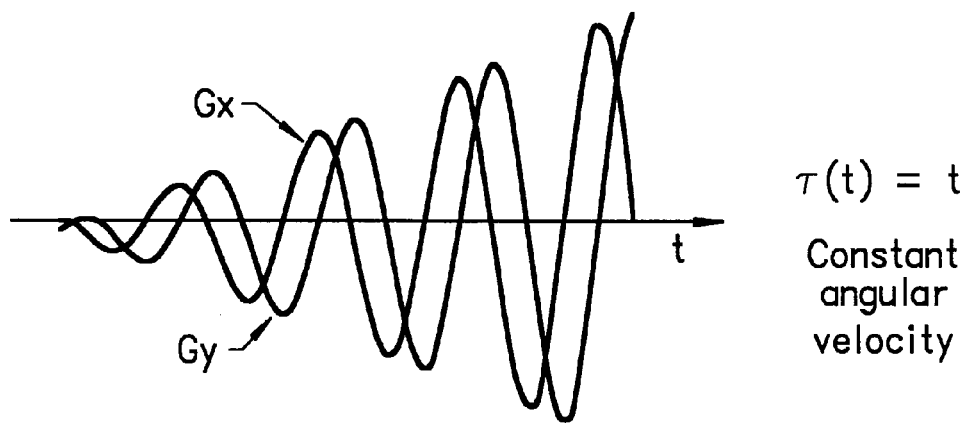

FIG. 4 is a definition of an Archimedean spiral k-space trajectory, and FIG. 5 is a demonstration of one possible set of Gx and Gy gradient waveforms that trace out the spiral defined in FIG. 4. These waveforms correspond to a constant-angular-velocity spiral, defined by setting τ(t)=t. The gradient waveforms are defined by $g(t)=iA\omega t e^{i\omega t}$.

Figure 6:
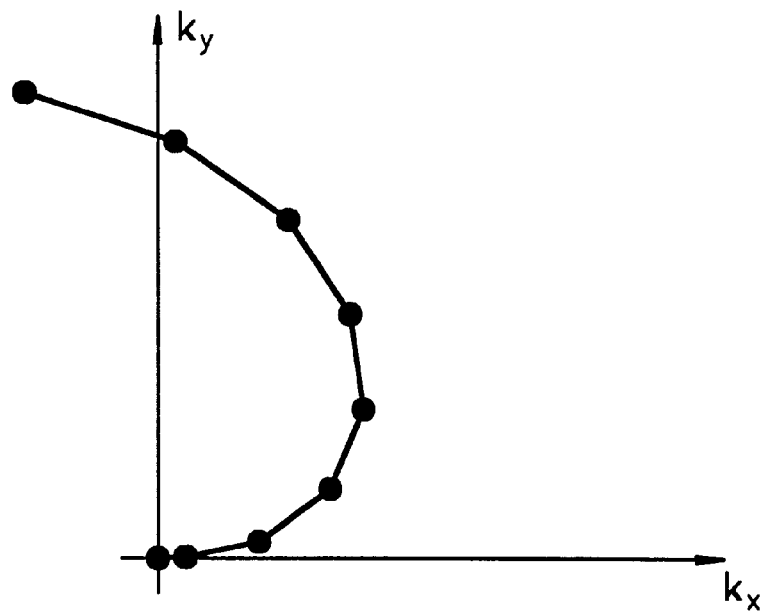
Figure 7:
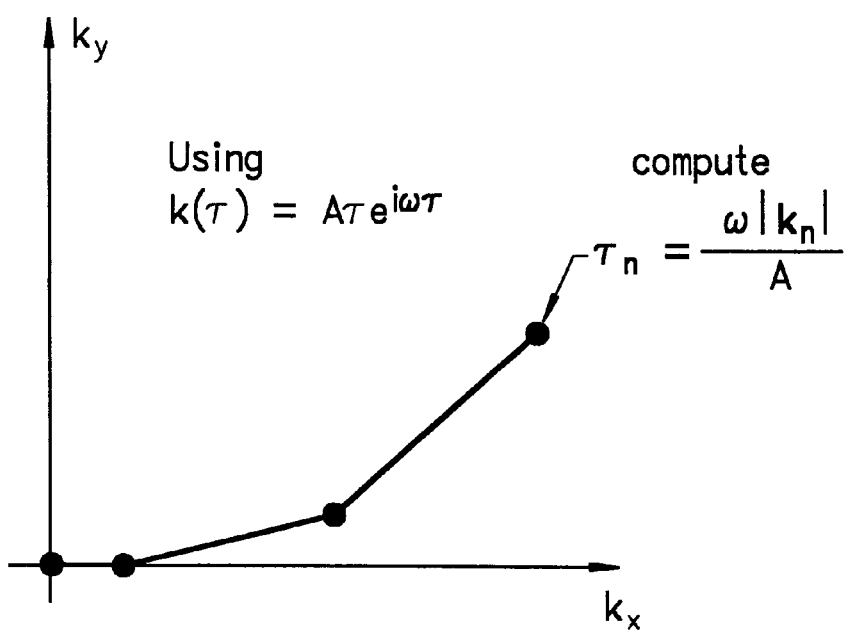
Figure 8:
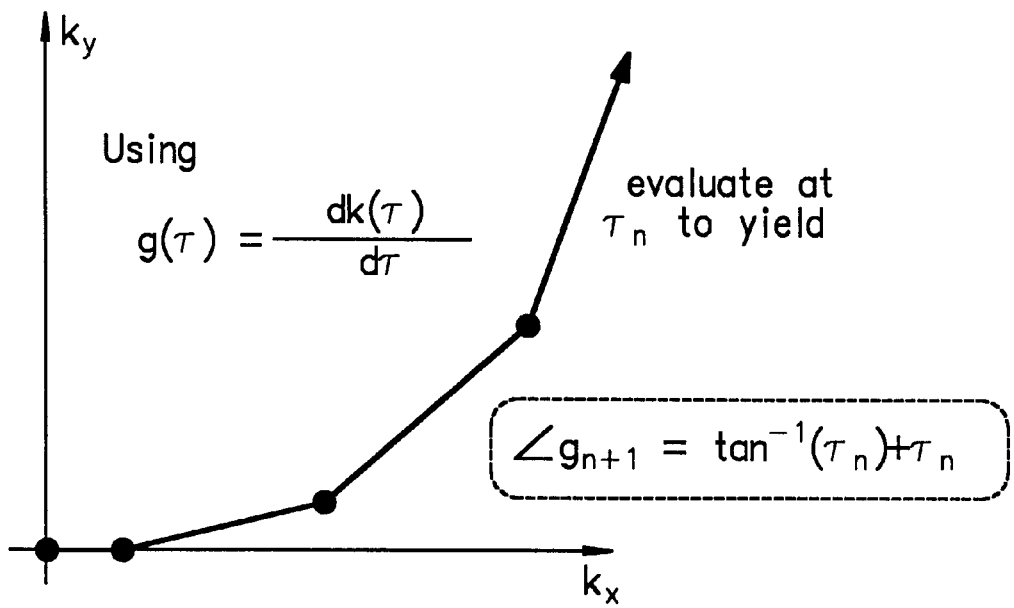

FIG. 6 illustrates a design of a discrete-time waveform, because gradient waveforms are typically defined as a sequence of discrete-time samples. FIG. 7 illustrates the first step of determining an estimate of τ, which defines the point along the desired trajectory corresponding to the next k-space sample. FIG. 8 illustrates the second step of determining the desired angle of the next gradient sample. To do this, evaluate the derivative of the trajectory at the value of τ determined in Step 1.

Figure 9:
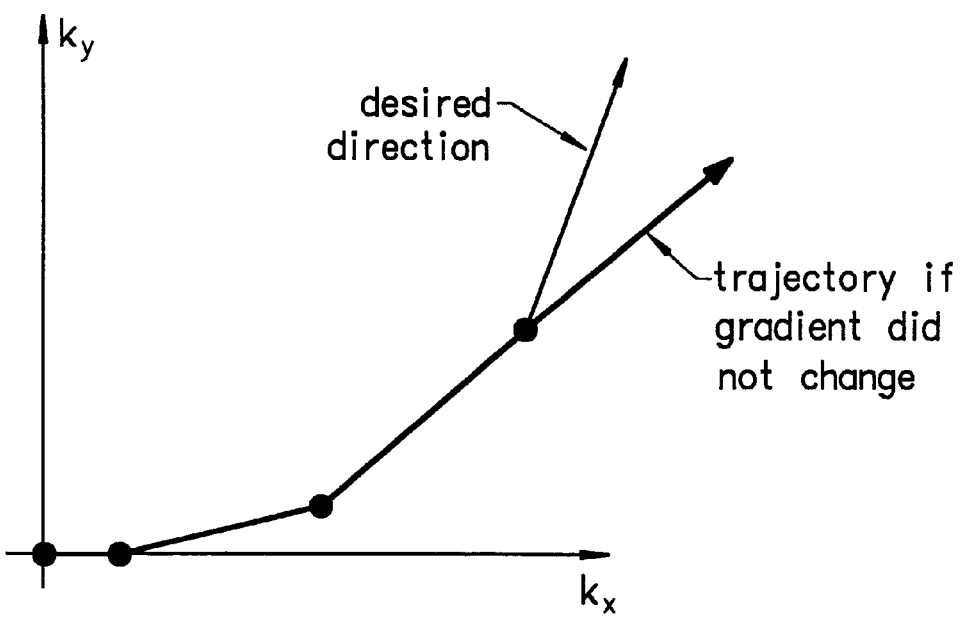

FIG. 9 illustrates the effect of changing the direction of the gradient. If the gradient sample were to stay the same for two samples, the direction of the k-space trajectory would also stay the same. However, changing the direction of the gradient to the angle determined in Step 1 leads to a turn in the trajectory. The difference between these two trajectories is equal to the change in the gradient times the gradient sampling time.

Figure 10:
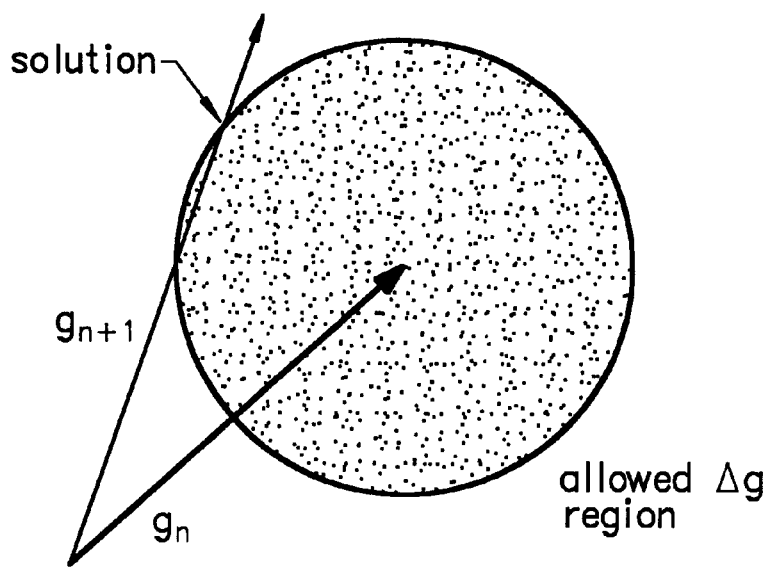

FIG. 10 illustrates determining the amplitude of the next gradient sample. Based on the idea of FIG. 9, it is easy to picture the feasible set for the next gradient sample. Any real gradient amplifier has a finite voltage, so the gradient waveform can only change so fast in a single sample. In this picture, this is illustrated by a circle surrounding the end of $g_n$, the previous gradient sample. (Other geometries are possible, depending upon the gradient model.) From Step 1, we know the desired angle of $g_{n+1}$. Any point in the intersection of the circle and the $g_{n+1}$ line is allowed. For a minimum-time spiral design, the point corresponding to the largest $|g_{n+1}|$ is chosen, as long as this is not larger than the largest $|g|$ allowed.

Figure 11:
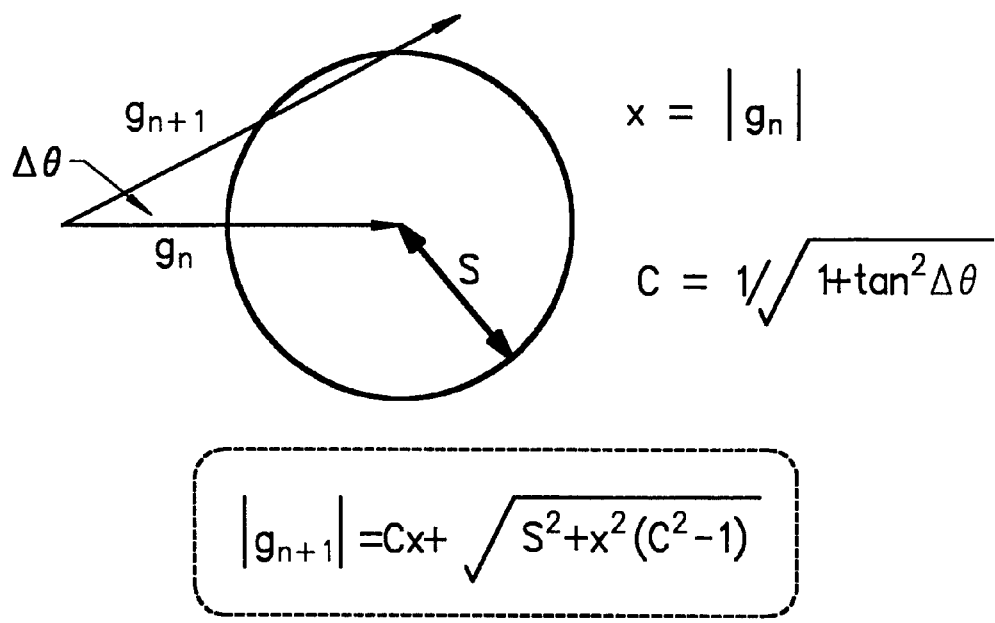

FIG. 11 illustrates Step 2 for a constant-slew-rate gradient design. Using this equation for $g_{n+1}$ generates a minimum-time spiral gradient with a constant vector slew rate. This equation is derived by solving for the intersection of the $g_{n+1}$ line with the circle of radius S centered around $g_n$. The symbol S corresponds to the maximum amount that a gradient can change in a single sampling interval. Note that there are two such intersections; here we choose the intersection corresponding to the larger $|g_{n+1}|$.

Figure 12:
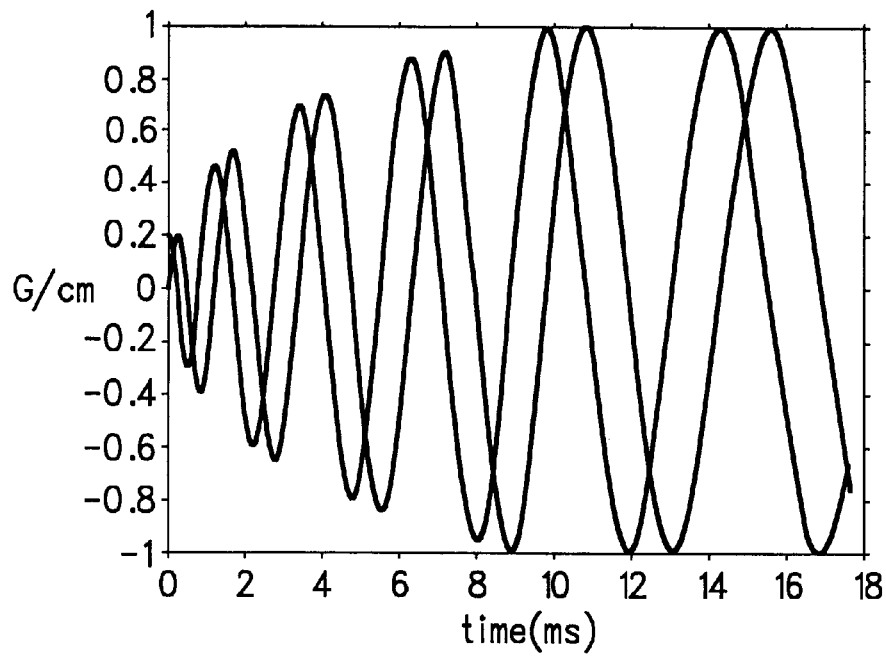

FIG. 12 illustrates an example of Gx and Gy gradients designed using a gradient model with a constraint on the maximum gradient slew rate and maximum gradient amplitude. During the first 9.5 ms, the gradients are constrained by the (vector) slew-rate limit. After the first 9.5 ms, they are constrained by the (vector) gradient amplitude limit. (Vector constraints are used in this case so that the gradients can be rotated along arbitrary axes. Alternatively, separate constraints can be applied along each axis, which would correspond to a constraint rectangle in FIG. 11 rather than a constraint circle.)

Figure 13:
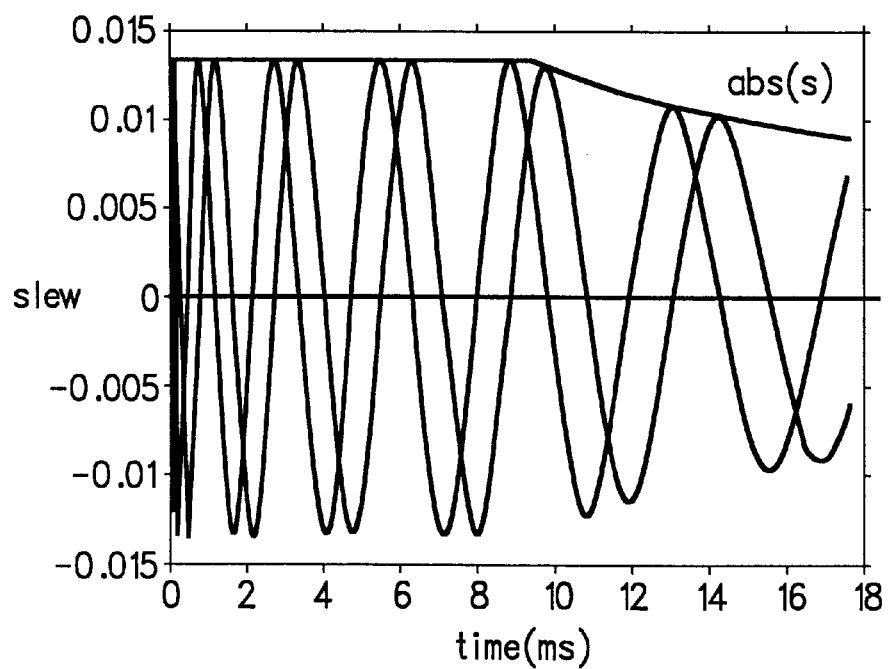

FIG. 13 illustrates the slew rate corresponding to the gradients of FIG. 12. The x-axis slew, y-axis slew, and absolute value of the slew are shown. The slew rate is the first difference of the gradients. Note that the slew is constant until the gradient amplitude limit is reached about 9.5 ms into the scan.

Figure 14:
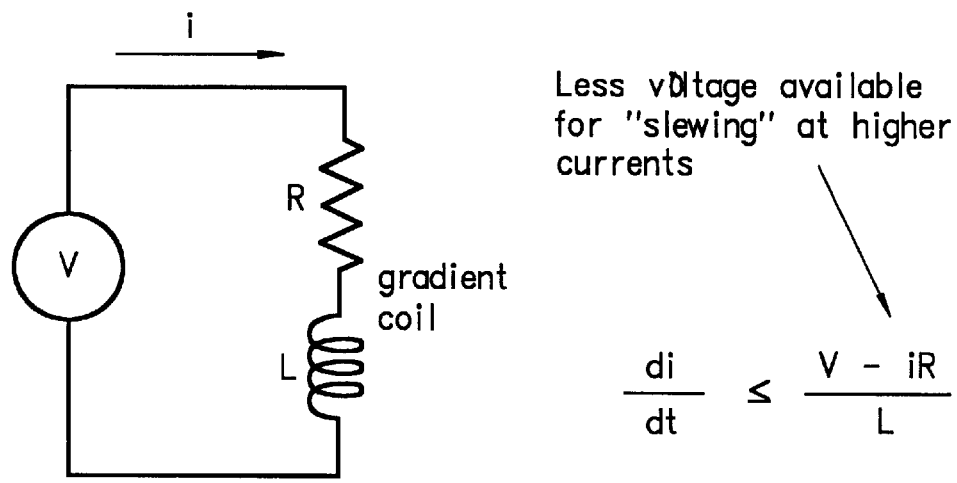

FIG. 14 is an LR model of a gradient system. This is an alternative to the simple maximum-slew-rate model. The current i through the gradient coil is proportional to the gradient amplitude. This current is controlled by the pulse programmer, under the constraint that the gradient amplifier can supply a maximum voltage V. The gradient coil (with its associated cables) is modeled as an inductor L and a resistor R is series. Solving this simple circuit leads to the constraint that $$\frac{di}{dt} \leq \frac{V - iR}{L}.$$

The maximum rate of change to the gradient amplitude is proportional to this $$\frac{di}{dt}.$$

Figure 15:
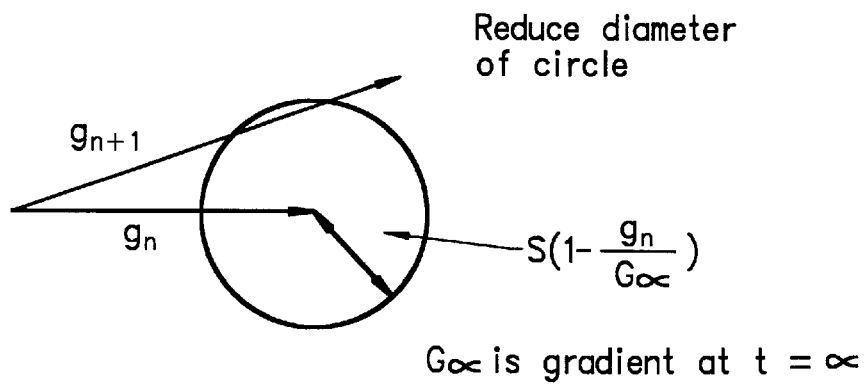

FIG. 15 illustrates one simple use of an LR model in the design. Note that as the gradient amplitude gets larger, the effective slew available gets smaller (for an increasing gradient). Thus, one could simply reduce the diameter of the constraint circle as the gradient amplitude increases.

Figure 16:
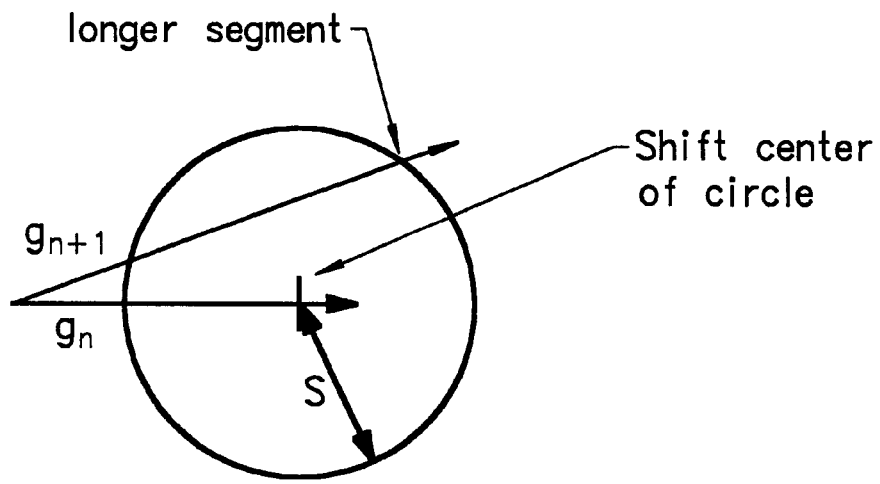

FIG. 16 illustrates a better use of the LR model than that in FIG. 15. Rather than reduce the diameter of the circle, one just shifts the center of the circle, which is the effect of the voltage drop across the series resistor of the LR model of Fir. 14. This leads to a larger $|g_{n+1}|$ and thus a better minimum-time gradient design.

Figure 17:
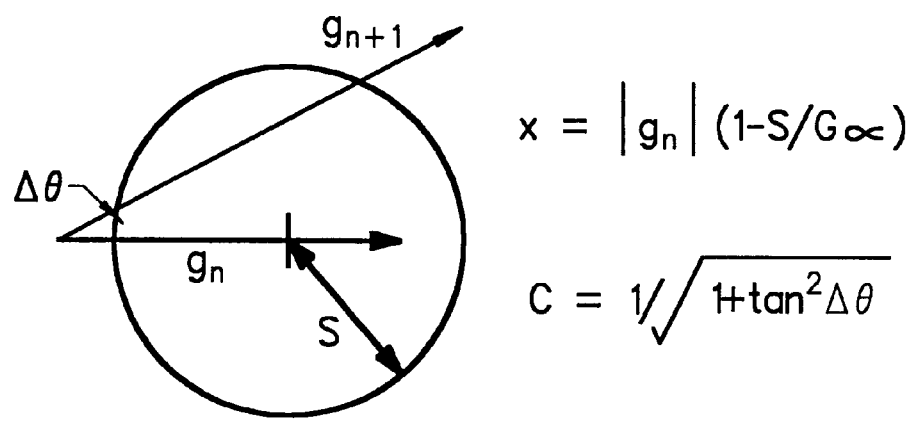

FIG. 17 illustrates Step 2 for an LR model of the gradients. Using this equation for $g_{n+1}$ generates a minimum-time spiral gradient with a constant (vector) voltage. This equation is derived by solving for the intersection of the $g_{n+1}$ line with the shifted circle of radius S. S corresponds to the maximum amount that a gradient can change in a single sampling interval starting from a gradient amplitude of zero. Note that there are two such intersections; here we choose the intersection corresponding to the larger $g_{n+1}$.

Figure 18:
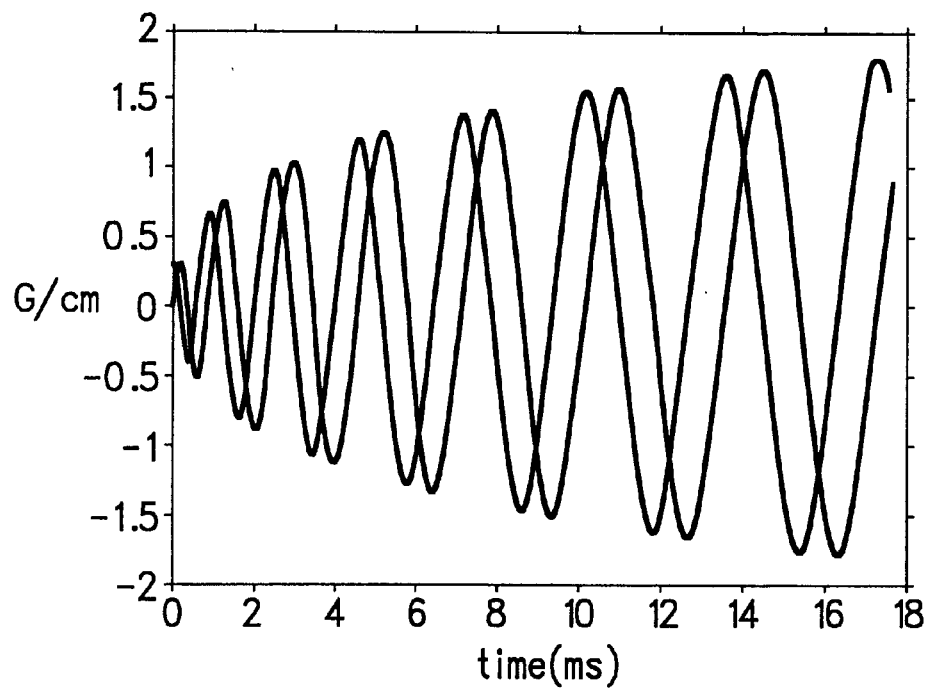
Figure 19:
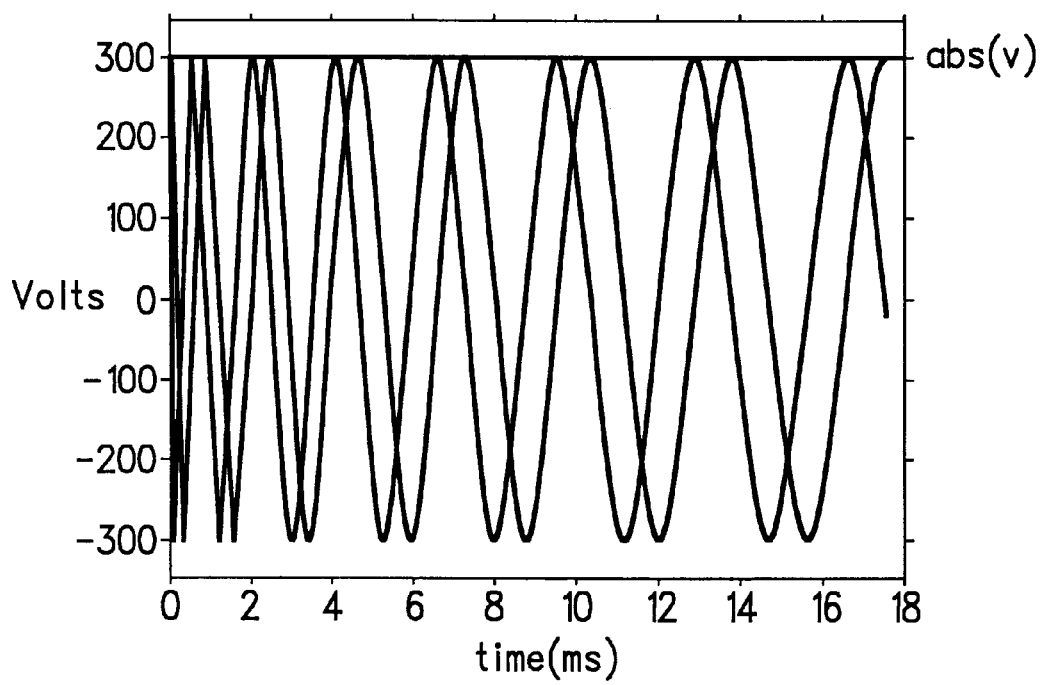
Figure 20:
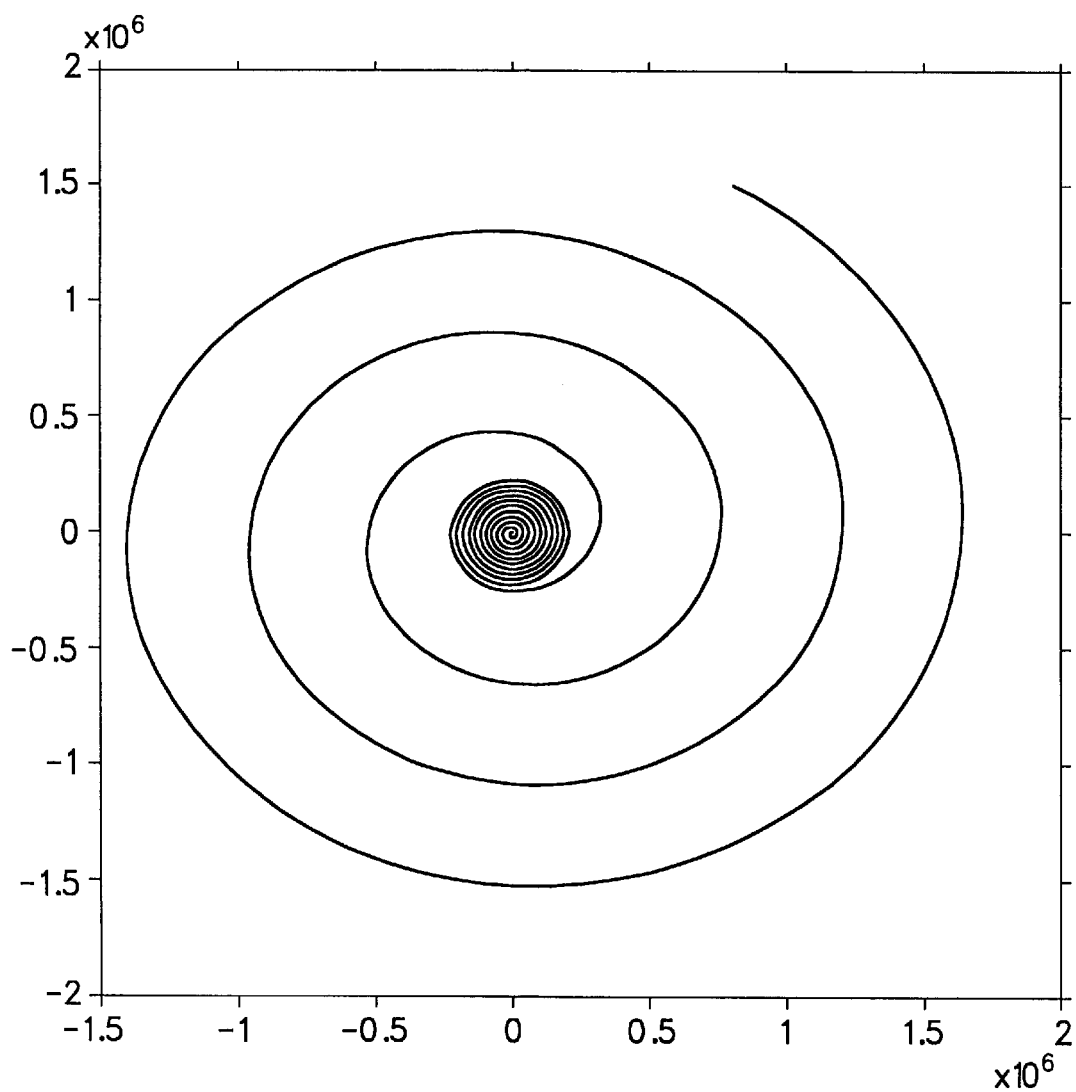
Figure 21:
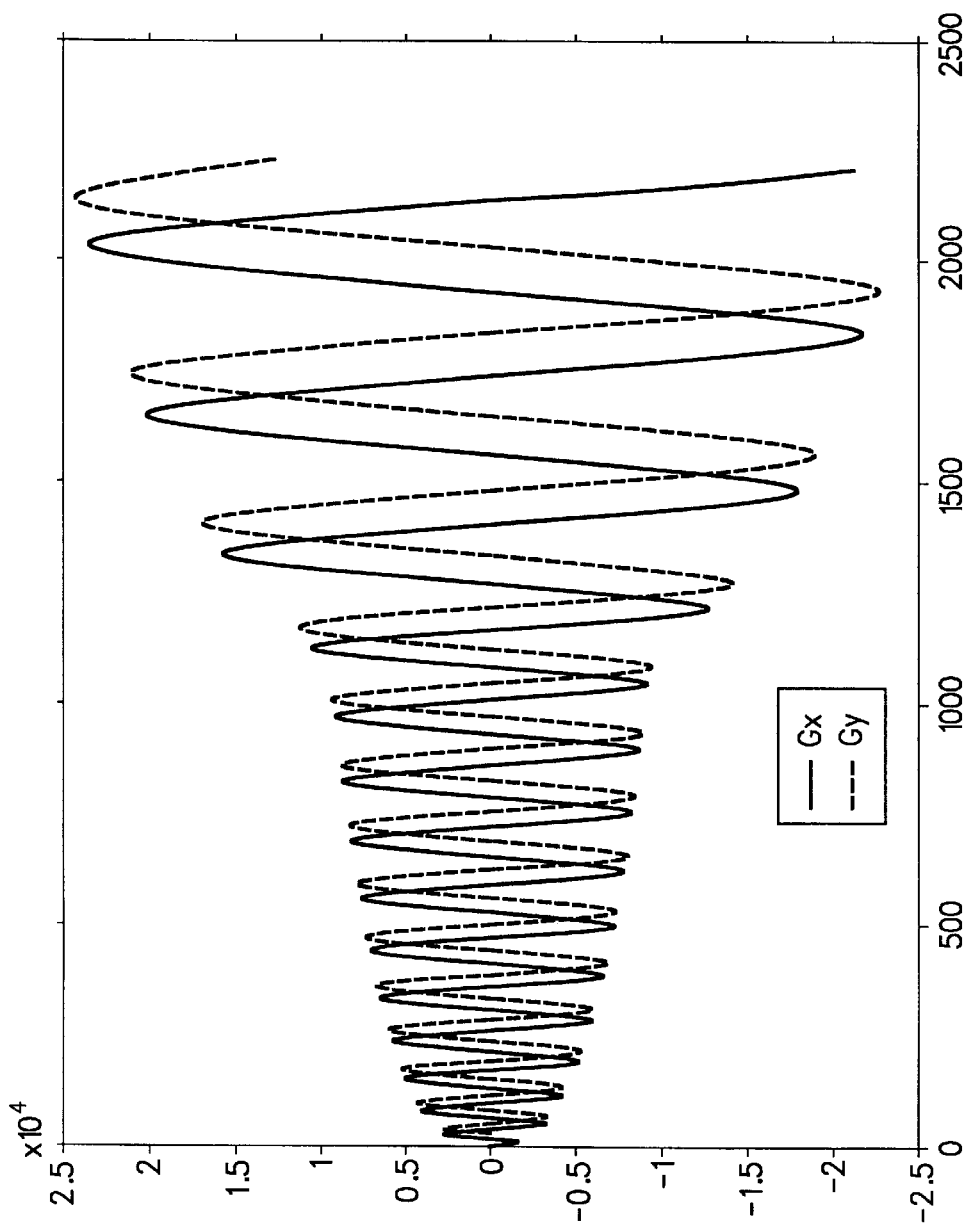

FIG. 18 illustrates an Example of Gx and Gy gradients designed using an LR gradient model, and FIG. 19 illustrates the required amplifier voltage corresponding to the gradients of FIG. 18. The x-axis voltage, y-axis voltage, and absolute value of the voltage are shown. The absolute value of the voltage is constant throughout the scan. FIG. 20 illustrates an example of a variable-density spiral in k-space for which gradients can be designed in accordance with the invention, and FIG. 21 illustrates gradient waveforms that trace out the spiral shown in FIG. 20 and designed in accordance with the invention.

What is claimed is:

1. A method of spiral gradient design for a k-space trajectory in magnetic resonance imaging, $k(\tau)=A\tau e^{i\omega\tau}$ where $\tau$ and $\omega$ can be functions of time, and where a discrete-time gradient waveform is $g_n$, comprising the steps of:
   a) determining the angle between a given gradient sample $g_n$ and the next gradient sample $g_{n+1}$, and
   b) determining the magnitude of $|g_{n+1}|$ using permissible change based on constraints of the magnetic resonance imaging system.

2. A method of spiral gradient design for a k-space trajectory in magnetic resonance imaging, $k(\tau)=A\tau e^{i\omega\tau}$ where $\tau$ and $\omega$ can be functions of time and where a discrete-time gradient waveform is $g_n$ and the discrete-time $k_n = \Sigma^n_{i=0} g_i$, assuming a series inductor-resistor (LR) gradient circuit model and using the gradient circuit parameters $$G \propto \frac{V}{R},$$

the steady-state gradient amplitude with a maximum voltage V applied, and $$S \propto \frac{V}{L}T,$$

the maximum step in gradient amplitude possible starting from an amplitude of zero, said method comprising the steps of:
   a) determining the angle, $\angle$, between a given gradient sample $g_n$ and the next gradient sample $g_{n+1}$ by evaluating the first derivative of $k(\tau)$ at the current value of $\tau$ and obtaining $$\angle g_{n+1} [L g_{n+1}] = \tan^{-1}\left(\omega \frac{|k_n|}{A}\right) + \omega \frac{|k_n|}{A}, \text{ and}$$

b) determining the magnitude of $|g_{n+1}|$ based on gradient constraints represented by a circle of radius, S $$\underline{S}\left[SoC\frac{V}{R}\right],$$

surrounding and offset from the distal end of $g_n$, where $|g_{n+1}|$ extends along $\angle g_{n+1}$ to the farthest intersection thereof with said circle.

3. The method as defined by claim 2 wherein an offset of the circle from the distal end of $g_n$ is due to voltage drop across the resistor, R, in the gradient circuit model.

4. The method as defined by claim 2 wherein the gradient circuit model is a constant voltage design with the center of the circle offset from the tip of $g_n$.

5. The method as defined by claim 4 wherein $$|g_{n+1}| = Cx_0 + \sqrt{S^2 + x_0^2(C^2-1)}$$

where $$x_o = |g_n|\left(1 - \frac{S}{G}\right)$$

$$C = \frac{1}{\sqrt{1+\tan^2\Delta\theta}}$$

$\Delta\theta$=angle between $g_n$ and $g_{n+1}$.

6. A method of spiral gradient design for a k-space trajectory in magnetic resonance imaging, $k(\tau)=A\tau e^{i\omega\tau}$ where $\tau$ and $\omega$ can be functions of time and where a discrete-time gradient waveform is $g_n$ and the discrete-time $k_n = \Sigma^n_{i=0} g_i$, assuming a gradient model with a maximum slew rate and a maximum gradient amplitude, said method comprising the steps of:
   a) determining the angle, $\angle$, between a given gradient sample $g_n$ and the next gradient sample $g_{n+1}$ by evaluating the first derivative of $k(\tau)$ at the current value of $\tau$ and obtaining $$\angle g_{n+1} = \tan^{-1}\left(\omega\frac{|k_n|}{A}\right) + \omega\frac{|k_n|}{A}, \text{ and}$$

b) determining the magnitude of $|g_{n+1}|$ based on gradient constraints represented by a maximum slew rate, S, and a maximum gradient amplitude, G, where S is the radius of a circle centered at the distal end of $g_n$.

7. The method as defined by claim 6 wherein the gradient circuit model is constant-slew design with the center of the circle at the tip of $g_n$.

8. The method as defined by claim 7 wherein $$|g_{n+1}| = Cx_0 + \sqrt{S^2 + x_0^2(C^2-1)}$$

where $$x_o = |g_n|\left(1 - \frac{S}{G}\right)$$

$$C = \frac{1}{\sqrt{1+\tan^2\Delta\theta}}$$

$\Delta\theta$=angle between $g_n$ and $g_{n+1}$.

* * * * *